US010360853B2

(12) United States Patent
Lee et al.

(10) Patent No.: US 10,360,853 B2
(45) Date of Patent: Jul. 23, 2019

(54) DISPLAY

(71) Applicant: InnoLux Corporation, Miao-Li County (TW)

(72) Inventors: Kuan-Feng Lee, Miao-Li County (TW); Yu-Sheng Tsai, Miao-Li County (TW); Kung-Chen Kuo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/593,356

(22) Filed: May 12, 2017

(65) Prior Publication Data

US 2017/0365219 A1 Dec. 21, 2017

(30) Foreign Application Priority Data

Jun. 17, 2016 (CN) .......................... 2016 1 0436094

(51) Int. Cl.

| | |
|---|---|
| ***G09G 3/3266*** | (2016.01) |
| ***G11C 19/28*** | (2006.01) |
| ***H01L 27/12*** | (2006.01) |
| ***G11C 19/18*** | (2006.01) |
| *G02F 1/1368* | (2006.01) |
| *H01L 27/15* | (2006.01) |
| *H01L 27/32* | (2006.01) |
| *H01L 29/786* | (2006.01) |

(52) U.S. Cl.

CPC ......... *G09G 3/3266* (2013.01); *G11C 19/184* (2013.01); *G11C 19/28* (2013.01); *H01L 27/1225* (2013.01); *G02F 1/1368* (2013.01); *G09G 2300/0426* (2013.01); *G09G 2310/0262* (2013.01); *G09G 2310/0286* (2013.01); *G09G 2310/061* (2013.01); *G09G 2310/08* (2013.01); *H01L 27/15* (2013.01); *H01L 27/3262* (2013.01); *H01L 29/7869* (2013.01); *H01L 29/78672* (2013.01)

(58) Field of Classification Search

CPC combination set(s) only.
See application file for complete search history.

(56) References Cited

U.S. PATENT DOCUMENTS

| | | | | |
|---|---|---|---|---|
| 2016/0232849 A1* | 8/2016 | Jeon | ..................... | G09G 3/3233 |
| 2016/0358666 A1* | 12/2016 | Pang | .................... | G11C 19/287 |
| 2017/0032731 A1* | 2/2017 | Shim | ................... | G09G 3/3677 |

* cited by examiner

*Primary Examiner* — Temesghen Ghebretinsae
*Assistant Examiner* — Sosina Abebe
(74) *Attorney, Agent, or Firm* — Bacon & Thomas, PLLC

(57) ABSTRACT

A display includes a substrate having a driver circuit with hybrid devices. The driver circuit includes first to fourth transistors. The first transistor includes a first control end connected to a clock signal, a first end connected to a high voltage, and a second end connected to a first node. The second transistor comprises metal oxide semiconductor, and includes a second control end connected to an input signal, a third end connected to a second node, and a fourth end connected to the first node. The third transistor comprises polysilicon semiconductor, and includes a third control end connected to the first node, and a fifth end connected to the high voltage, and a sixth end connected to an output voltage. The fourth transistor includes a fourth control end connected to the input signal, a seventh end connected to the third node, and an eighth end connected to the output voltage.

7 Claims, 14 Drawing Sheets

DISPLAY

BACKGROUND OF THE INVENTION

1. Field of the Invention

The present disclosure relates to the technical field of displays and, more particularly, to a display having a driving circuit with hybrid devices.

2. Description of Related Art

The active components using thin film transistors for driving are widely used in active matrix displays. The types of active layer of thin film transistors mainly include low temperature poly-silicon (LTPS) thin film transistors, indium-gallium-zinc oxide (IGZO) thin film transistors and amorphous silicon (a-Si) thin film transistors.

The gate driving circuits of the prior displays mainly adopt LTPS thin film transistors, which have good carrier mobility, and provide larger on-state currents; however, they are disadvantageous about leakage current, which causes larger off-state current. IGZO thin film transistors have good electric uniformity, and provide smaller off-state current, but their on-state current is not as good as that of LTPS thin film transistors.

In view of this, it needs to develop a gate driving circuit of displays to mitigate the aforementioned problems, so as to provide a more effective and stable circuit.

SUMMARY OF THE INVENTION

The present disclosure integrates polysilicon transistors, particularly LTPS thin film transistors, and metal oxide transistors, particularly IGZO thin film transistors, into a circuit for forming a driving circuit with hybrid devices. It is applicable in at least one of driving circuits and pixel units, in particular, applicable in inverters or shift registers of driving circuits of OLED displays. By arranging polysilicon thin film transistors and metal oxide thin film transistors in specific parts of a circuit, these two kinds of transistors can exhibit their advantages.

Accordingly, the present disclosure provides a display, which includes a substrate having a driving circuit with hybrid devices. The driving circuit with hybrid devices includes a first transistor having a first control end, a first end and a second end, the first control end being connected to a clock signal, the first end being connected to a high voltage, the second end being connected to a first node; a second transistor having a second control end, a third end and a fourth end, the second control end being connected to an input signal, the third end being connected to a second node, the fourth end being connected to the first node; a third transistor having a third control end, a fifth end and a sixth end, the third control end being connected to the first node, the fifth end being connected to the high voltage, the sixth end being connected to an output voltage; and a fourth transistor having a fourth control end, a seventh end and an eighth end, the fourth control end being connected to the input signal, the seventh end being connected to a third node, the eighth end being connected to the output voltage; wherein the second transistor comprises metal oxide semiconductor, and the third transistor comprises polysilicon semiconductor.

Moreover, the present disclosure provides a display, which includes a substrate having a driving circuit with hybrid devices. The driving circuit with hybrid devices includes: a first transistor having a first control end, a first end and a second end, the first control end being connected to a first clock signal, the first end being connected to a first node, the second end being connected to a second node; a second transistor having a second control end, a third end and a fourth end, the second control end being connected to the second node, the third end being connected to a second clock signal, the fourth end being connected to an output voltage; a third transistor having a third control end, a fifth end and a sixth end, the third control end being connected to a third clock signal, the fifth end being connected to a high voltage, the sixth end being connected to a third node; a fourth transistor having a fourth control end, a seventh end and an eighth end, the fourth control end being connected to an input signal, the seventh end being connected to a low voltage, the eighth end being connected to the third node; a fifth transistor having a fifth control end, a ninth end and a tenth end, the fifth control end being connected to the third node, the ninth end being connected to the low voltage, the tenth end being connected to the output voltage; and a sixth transistor having a sixth control end, an eleventh end and a twelfth end, the sixth control end being connected to the third node, the eleventh end being connected to the low voltage, the twelfth end being connected to a fourth node, the fourth node being directly or indirectly connected to the second node; wherein the fourth transistor comprises first metal oxide semiconductor, and the second transistor comprises polysilicon semiconductor.

DETAILED DESCRIPTION OF THE PREFERRED EMBODIMENT

In the following, the implementation according to the present disclosure is explained by some specific embodiments. A person skilled in the art according to the present disclosure can understand the features and the effects according to the present disclosure from the content disclosed in this specification. The present disclosure can be implemented or applicable in other specific embodiments. In different aspects, the detailed contents in this specification can be modified within the spirit according to the present disclosure.

Figure 1A:
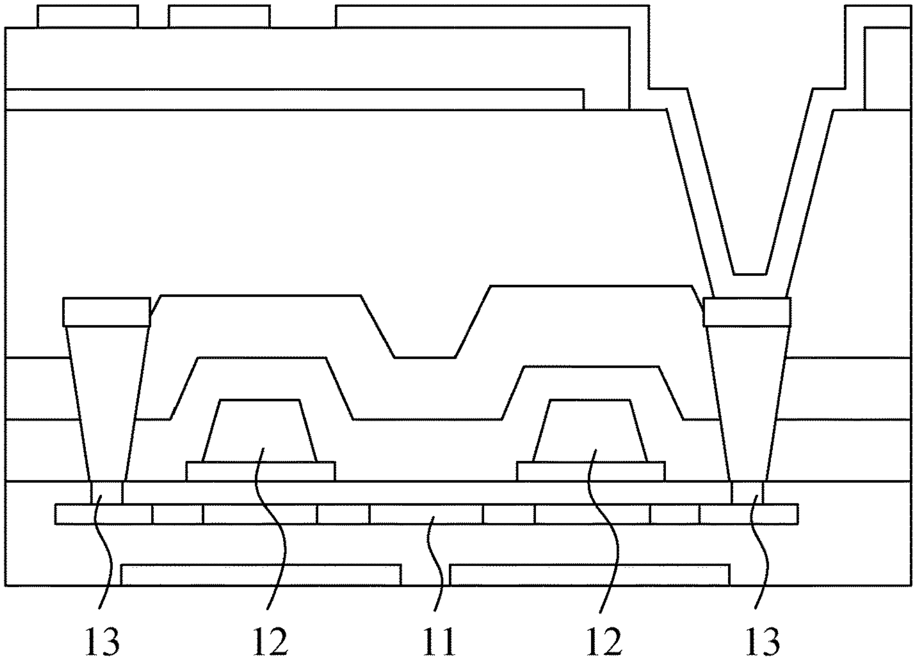
FIGS. 1A and 1B show a gate-on-top thin film transistor structure and a gate-on-bottom thin film transistor structure, respectively.
Figure 1B:
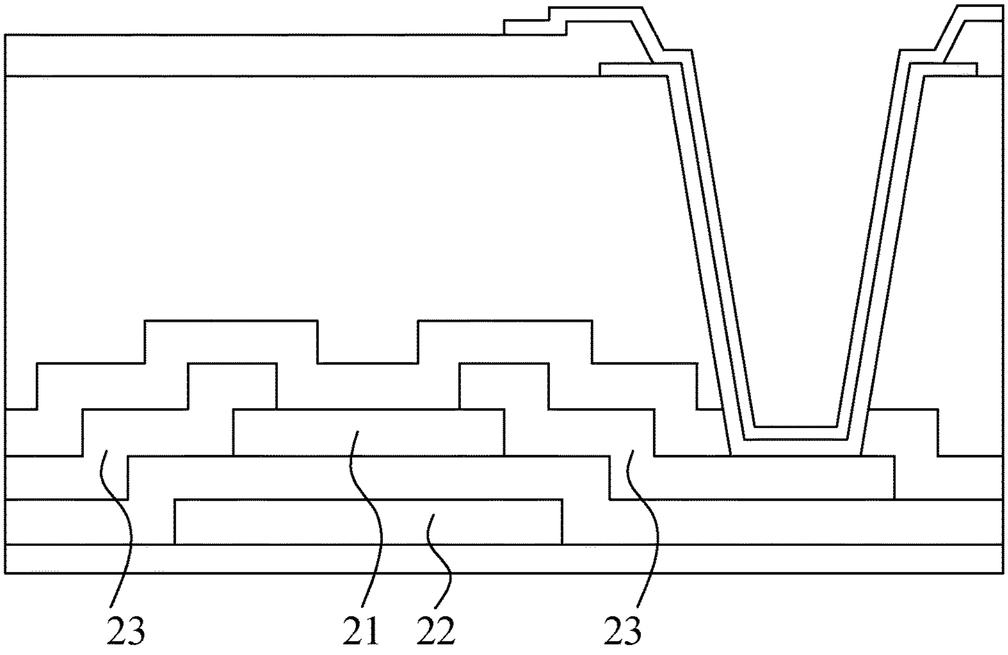
Figure 2:
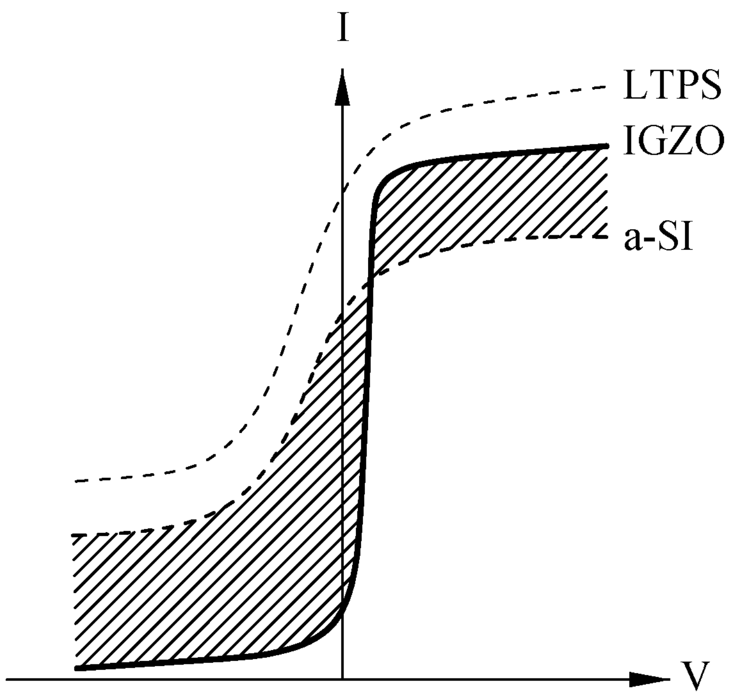
FIG. 2 shows the current-voltage curves of LTPS, IGZO and a-Si thin film transistors.

The material of the active layer (semiconductor layer) of a transistor can be silicon, germanium or silicide, for example, SiGe or SiAs, and silicon can be monocrystalline silicon, amorphous silicon or polysilicon, particularly LTPS; the material of the active layer of a transistor can also be metal oxide, for example, $In_2O_3$, IZO, ZTO, IGO, IGZO, $SnO_2$, NiO, $Cu_2O$ and ZnO. FIG. 1A shows a gate-on-top (top gate) thin film transistor structure, wherein the gate 12 is on the active layer 11. At least an insulating layer is disposed between the gate 12 and the active layer 11. The drain and source 13 contact the two sides of the active layer 11. The active layer 11 can be one layer or include multiple layers. The material of the active layer 11 can be polysilicon, for example, LTPS. FIG. 1B shows a gate-on-bottom (bottom gate) thin film transistor structure, wherein the gate 22 is below the active layer 21, at least an insulating layer is disposed between the gate 12 and the active layer 11, and the drain and source 23 contact the two sides of the active layer 21. The active layer 21 can be one layer or include multiple layers. The material of the active layer can be metal oxide, for example, IGZO. FIG. 2 shows the current-voltage curves of LTPS, IGZO and a-Si thin film transistors. FIG. 2 illustrates the relative magnitude of the on-state currents and the relative magnitude of the off-state currents for the three kinds of thin film transistors. Moreover, in FIG. 2, the ratios of on-to-off currents (Ion/Ioff) for LTPS, IGZO and a-Si transistors are $10^7$, $10^9$ and $10^6$, respectively.

Figure 3:
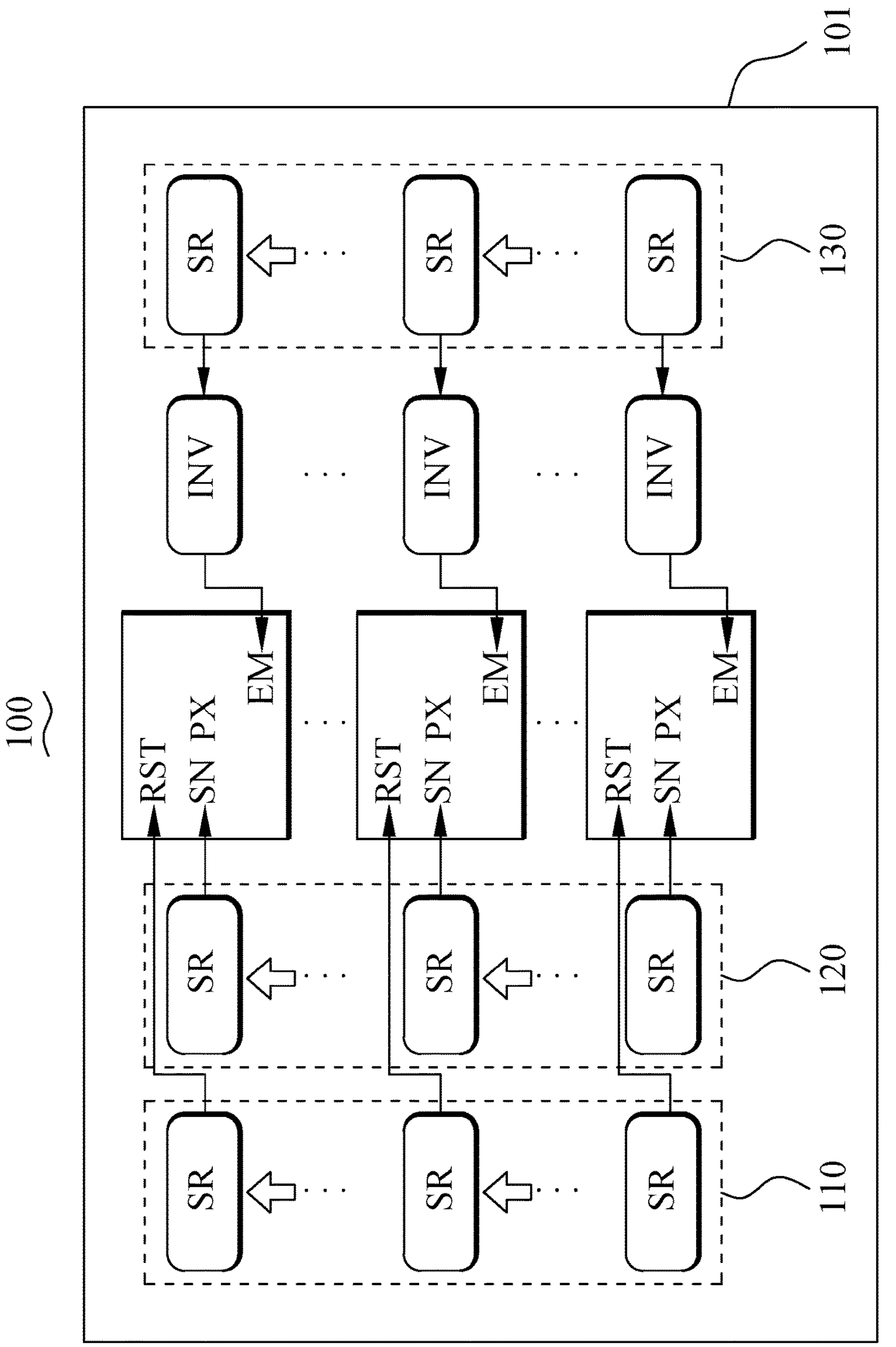
FIG. 3 shows the system diagram of the OLED display according to the present disclosure.

FIG. 3 shows the system diagram of the display according to the present disclosure. In the embodiment, the display is an OLED (organic light emitting diode) display. In other embodiment, the display could be liquid crystal display (LCD), micro-sized inorganic LED display (micro LED), quantum dot LED display (QLED), or other types of display. As shown in FIG. 3, the OLED display 100 includes a substrate 101. On the substrate 101, there are a first shift register series 110, a second shift register series 120, a third shift register series 130, a plurality of inverters (INV) and a plurality of pixel units (PX), wherein each of the first shift register series 110, the second shift register series 120, and the third shift register series 130 includes a plurality of shift registers (SR). The first shift register series 110 provides reset signals RST, the second shift register series 120 provides driving signals SN, and the third shift register series 130 provides emission signals EM through the inverters INV. Each pixel unit PX receives the reset signal RST, the driving signal SN and the emission signal EM for controlling the emission of the OLED in the pixel unit PX. The driving circuits with hybrid devices in the following embodiments can be included in a display. In some embodiments, the driving circuit with hybrid devices can be an inverter; in other embodiments, the driving circuit with hybrid devices can be a shift register.

The First Embodiment

Figure 4A:
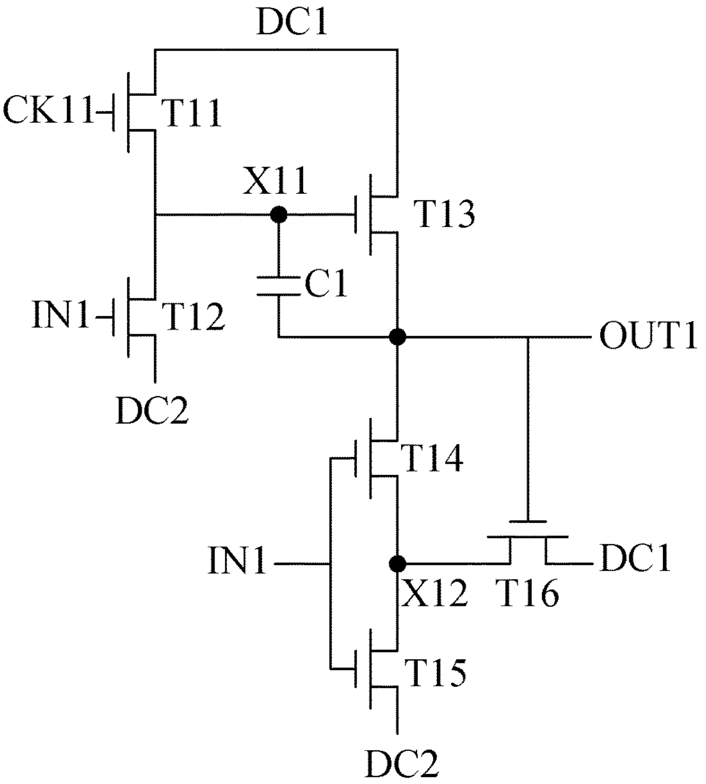
FIGS. 4A and 4B show the driving circuit with hybrid devices in the first embodiment according to the present disclosure and its signal timing diagram, respectively.

FIG. 4A shows the driving circuit with hybrid devices in the first embodiment according to the present disclosure. This embodiment is an inverter, which includes a first transistor T11, a second transistor T12, a third transistor T13, a fourth transistor T14, a fifth transistor T15, a sixth transistor T16 and a capacitor C1. Each transistor has a control end serving as a gate, one end serving as a source, and the other end serving as a drain. As shown in FIG. 4A, the drain of the first transistor T11 is connected to the high voltage DC1 (signal source), the source thereof is connected to the first node X11, and the gate thereof is connected to the clock signal CK11 (signal source). The drain of the second transistor T12 is connected to the first node X11, the source thereof is connected to the low voltage DC2 (signal source), and the gate thereof is connected to the input signal IN1 (signal source). One end of the capacitor C1 is connected to the first node X11, and the other end thereof is connected to the output voltage OUT1. The drain of the third transistor T13 is connected to the high voltage DC1 (signal source), the source thereof is connected to the output voltage OUT1, and the gate thereof is connected to the first node X11. The drain of the fourth transistor T14 is connected to the output voltage OUT1, the source thereof is connected to the third node X12, and the gate thereof is connected to the input signal IN1 (signal source). The drain of the fifth transistor T15 is connected to the third node X12, the source thereof is connected to the low voltage DC2 (signal source), and the gate thereof is connected to the input signal IN1 (signal source). The drain of the sixth transistor T16 is connected to the high voltage DC1 (signal source), the source thereof is connected to the third node X12, and the gate thereof is connected to the output voltage OUT1.

In this embodiment, the transistors are n-type transistors; that is, the present embodiment is an all n-type transistor circuit, for which the manufacturing is more convenient. In other embodiments, an all p-type transistor circuit and an n-type and p-type hybrid transistor circuit are also applicable.

Figure 4B:
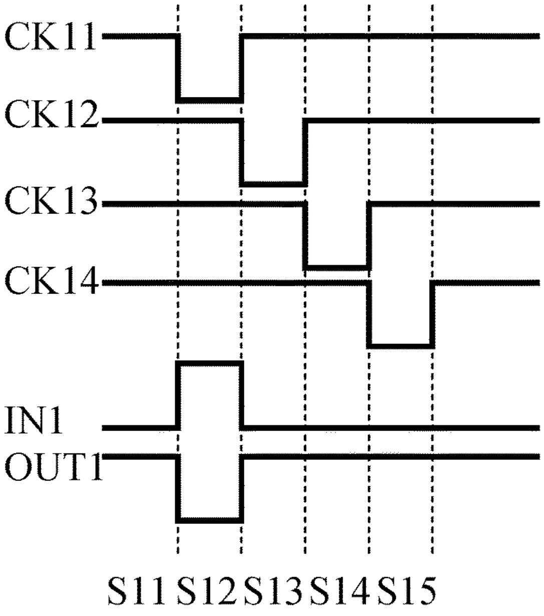

FIG. 4B shows the signal timing diagram of the driving circuit with hybrid devices in this embodiment, wherein clock signals CK11, CK12, CK13 and CK14 cyclically produce square signals in order. The time for a cycle can be set as a frame period. The peak of a clock signal can be set to the high voltage DC1, and the valley thereof can be set to the low voltage DC2. In other embodiment, clock signals could be sine signals, triangle signals, or saw-tooth signals.

Regarding the operation of this embodiment, please refer to FIGS. 4A and 4B.

In the operation period S11, the input signal IN is low, so the second transistor T12, the fourth transistor T14 and the fifth transistor T15 are turned off, and the voltages of all nodes stop being pulled down. In this operation period, clock signal CK11 is high, so the first transistor T11 is turned on, the current flows from the high voltage DC1 to the first node X11, the capacitor C1 is charged, and the voltage of the first node X11 is pulled high. Therefore, the third transistor T13 is turned on, the current flows from the high voltage DC1 to the output voltage OUT1, and the output voltage OUT1 is pulled high.

It is noted that this embodiment is an all n-type transistor circuit, and the n-type transistor can be turned on only if the gate-source voltage difference (VGS) reaches the threshold voltage (Vth) of the transistor. In order to completely transmit the high voltage DC1 to the output voltage OUT1, the voltage of the first node X11 must be higher than the high voltage DC1 by a threshold voltage (Vth) of the transistor, that is, V(X11)≥V(DC1)+Vth. For this, the capacitor C1 is arranged to pull up the voltage of the first node X1. Since one end of the capacitor C1 is connected to the output voltage OUT1, after the capacitor C1 is charged, the aforementioned formula can be satisfied.

In the operation period S12, the clock signal CK11 is low, so the first transistor T11 is turned off, and the current stop flowing from the high voltage DC1 to the first node X11. In this operation period, the input signal IN is high, so the second transistor T12 turned on, the current flows from the first node X11 to the low voltage DC2, and the first node X11 is pulled low. Therefore, the third transistor T13 is turned off, and the current stop flowing from the high voltage DC1 to the output voltage OUT1. Since the input signal IN is high, the fourth transistor T14 and the fifth transistor T15 are turned on as well, the current flows from the output voltage OUT1 to the low voltage DC2, and the output voltage OUT1 is pulled low.

The operation in the operation period S13 is substantially the same as that in the operation period S11, and the states in the operation periods S14 and S15 continue the state in the operation period S11.

Therefore, as shown in FIG. 4B, the output voltage OUT1 is opposite to the input signal IN1, so this embodiment provides the function of an inverter.

In FIG. 4B, it can be seen that the output voltage OUT1 is kept high for a long time. For this, the fourth transistor T14 and the fifth transistor T15 form a series for reducing the leakage current. Moreover, when the output voltage OUT1 is high, the sixth transistor T16 is turned on, the current flows from the high voltage DC1 to the third node X12, and the voltage of the third node X12 is pulled high. This can reduce the drain-source voltage difference (VDS) of the fourth transistor T14 for reducing leakage current.

In order to keep the output voltage OUT1, the first node X11 must be kept high for a long time. Since this embodiment is an all n-type transistor circuit, the voltage of the first node X11 must be higher than the high voltage DC1 by a threshold voltage (Vth) of the transistor, that is, V(X11)≥V(DC1)+Vth, such that the high voltage DC1 can be completely transmitted to the output voltage OUT1. Therefore, the drain-source voltage difference (VDS) of the second transistor T12 is larger, so leakage current is larger as well. Considering this problem, the second transistor T12 can be an IGZO thin film transistor for reducing leakage current. In other embodiments, an IGZO thin film transistor can be replaced by other kinds of metal oxide thin film transistors, for example, $In_2O_3$, IZO, ZTO, IGO, $SnO_2$, NiO, $Cu_2O$ and ZnO transistors.

Moreover, the third transistor T13 can be an LTPS thin film transistor for rapidly pulling up the output voltage OUT1; the fourth transistor T14 can be an LTPS thin film transistor for rapidly pulling down the output voltage OUT1. This can avoid an input-output (IN-OUT) shift. In other embodiments, an LTPS thin film transistor can be replaced by other kinds of polysilicon thin film transistors.

The First Comparison Embodiment

In the first comparison embodiment, the second transistor T12 is set to be an LTPS thin film transistor, and the remaining parts of the circuit are the same as those in the first embodiment.

Figure 5:
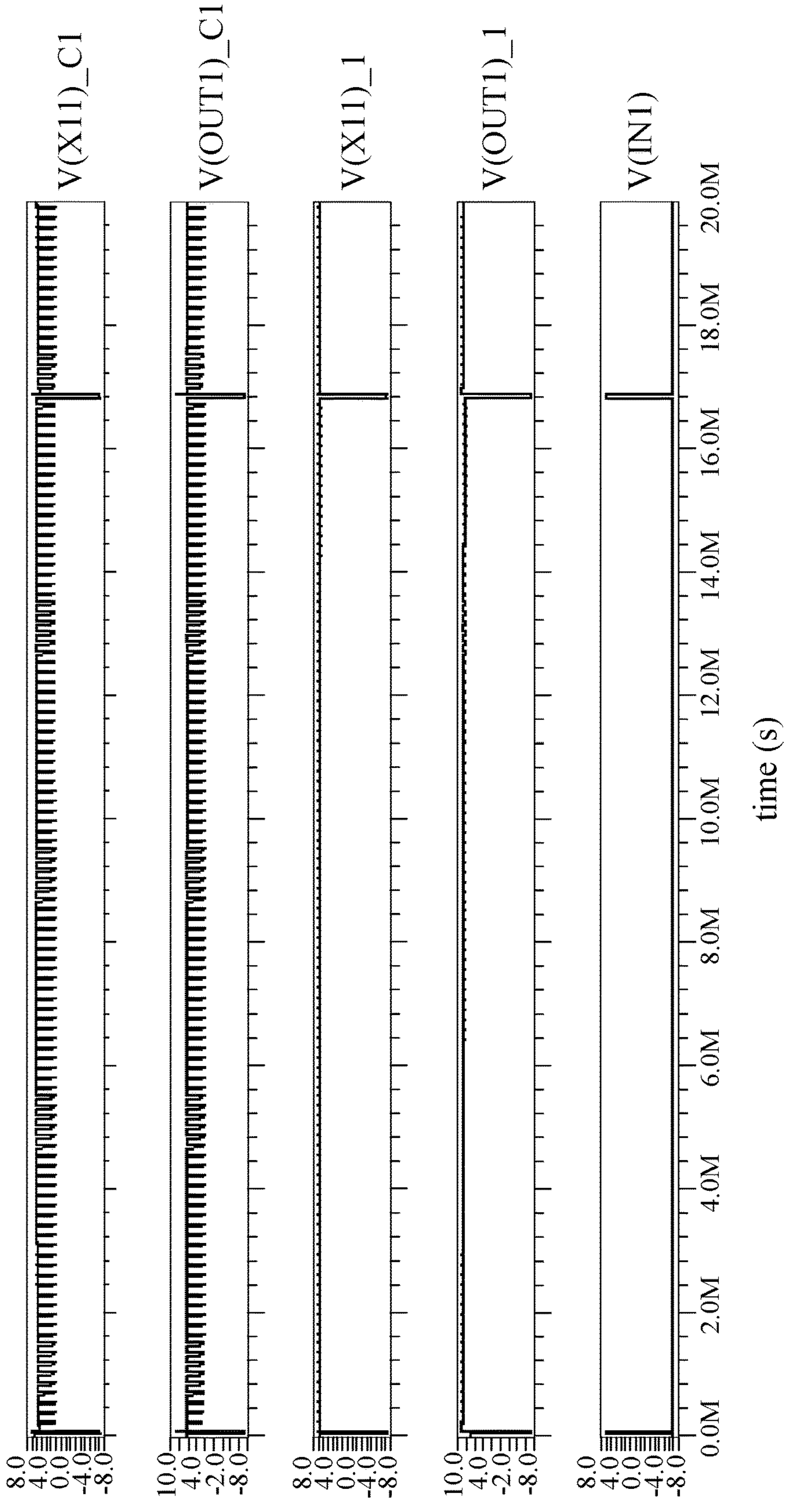
FIG. 5 shows the simulation results of the first embodiment and the first comparison embodiment according to the present disclosure.

FIG. 5 shows the simulation results of the first embodiment and the first comparison embodiment according to the present disclosure. As shown, V(X11)_1 and V(OUT1)_1 represent the voltage of the first node X11 and the output voltage OUT1 in the first embodiment, respectively; V(X11)_C1 and V(OUT1)_C1 represent the voltage of the first node X11 and the output voltage OUT1 in the first comparison embodiment, respectively; V(IN1) represents the voltage of the input signal IN1, which is commonly used in the two embodiments. By observing FIG. 5, since the second transistor T12 in the first comparison embodiment is set to be an LTPS thin film transistor, V(X11)_C1 and V(OUT1)_C1 are influenced by the leakage current and thus have lower voltages, and they are also influenced by the clock signal CK11, resulting in generation of high frequency ripples. Comparatively, since the second transistor T12 in the first embodiment is set to be an IGZO thin film transistor, the aforementioned problems can be mitigated.

The Second Embodiment

Figure 6:
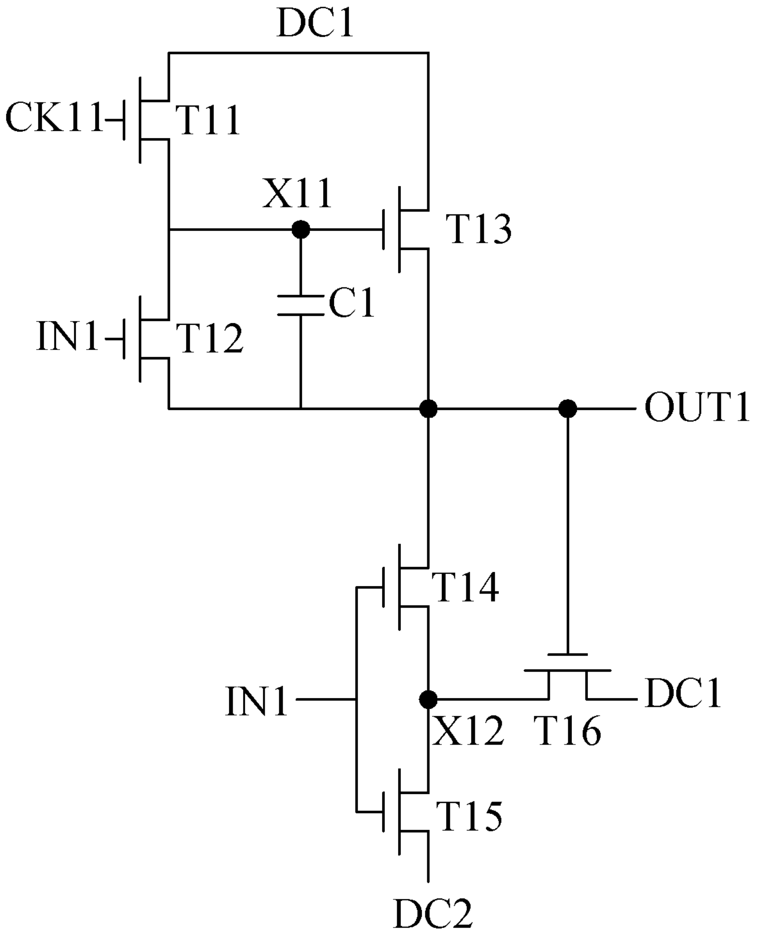
FIG. 6 shows the driving circuit with hybrid devices in the second embodiment according to the present disclosure.

FIG. 6 shows the driving circuit with hybrid devices in the second embodiment according to the present disclosure. As shown in FIG. 6, in this embodiment, the source of the second transistor T12 is not connected to the low voltage DC2 (signal source), instead, it is connected to the output voltage OUT1, and the remaining parts of the circuit are the same as those in the first embodiment. The operations are also the same as those in the first embodiment, and thus a detailed description therefor is deemed unnecessary.

Figure 7:
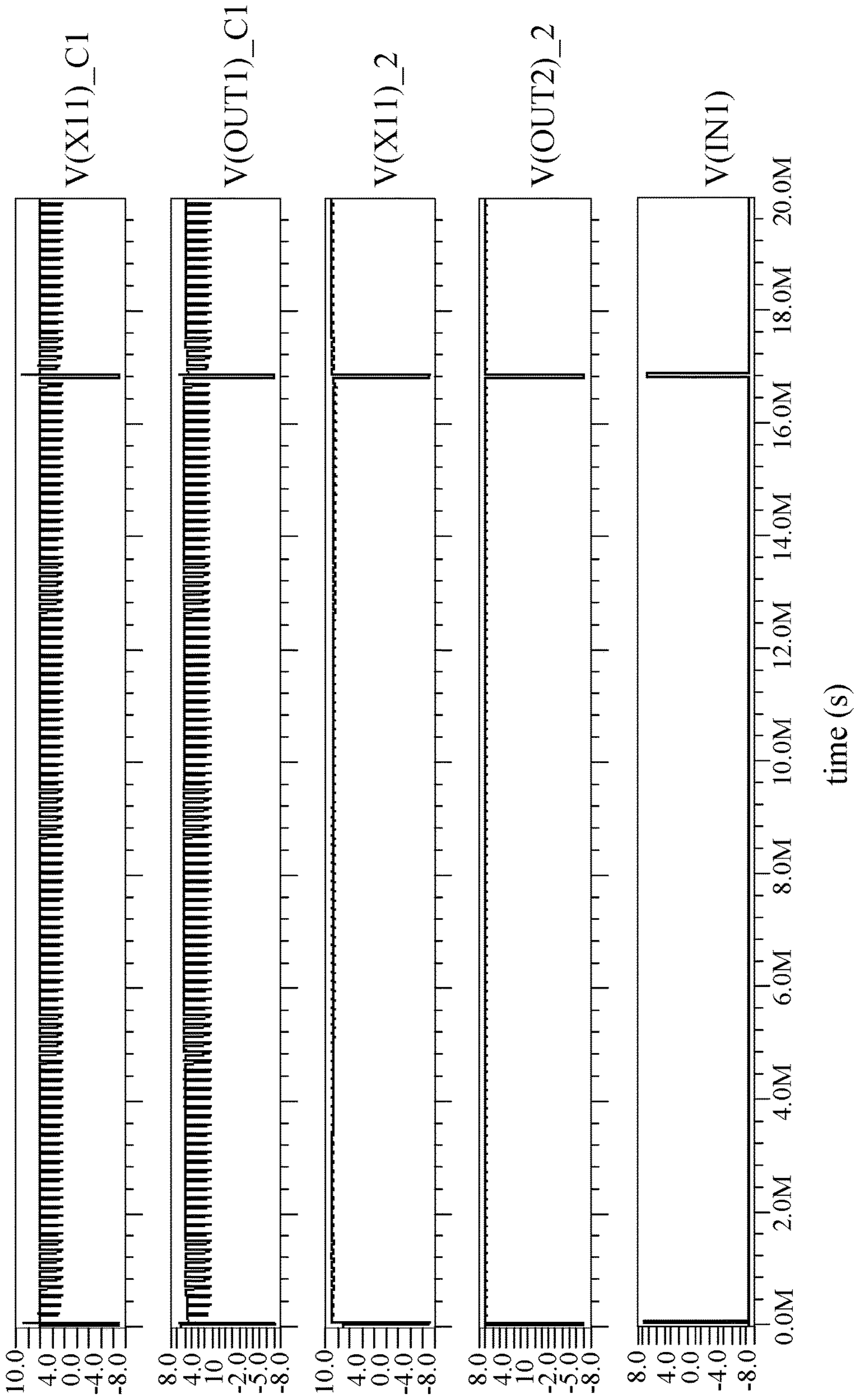
FIG. 7 shows the simulation results of the second embodiment and the first comparison embodiment according to the present disclosure.

FIG. 7 shows the simulation results of the second embodiment and the first comparison embodiment according to the present disclosure. As shown, V(X11)_2 and V(OUT1)_2 represent the voltage of the first node X11 and the output voltage OUT1 in the second embodiment, respectively; V(X11)_C1 and V(OUT1)_C1 represent the voltage of the first node X11 and the output voltage OUT1 in the first comparison embodiment, respectively; V(IN1) represents the voltage of the input signal IN1, which is commonly used in the two embodiments. As shown in FIG. 7, this embodiment and the first embodiment have similar simulation results. Therefore, this embodiment can simplify the circuit without changing the function of the circuit.

The Third Embodiment

Figure 8:
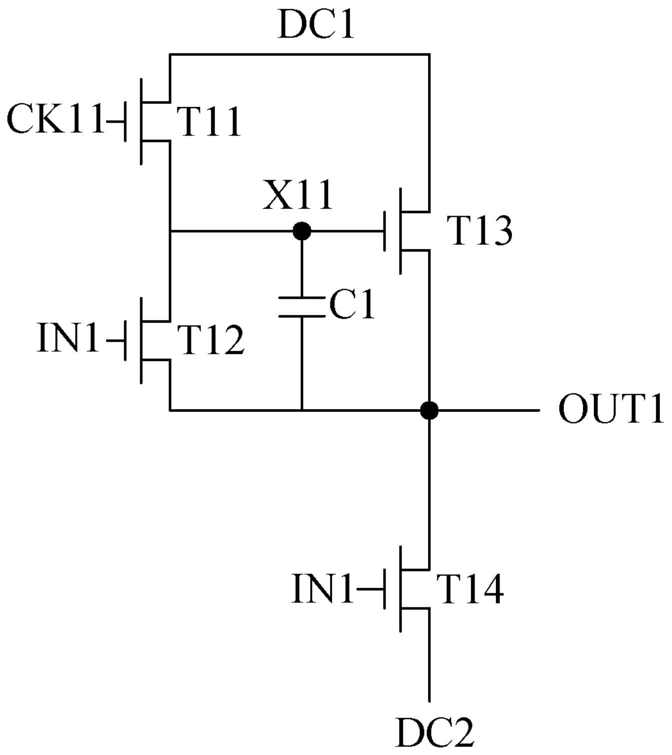
FIG. 8 shows the driving circuit with hybrid devices in the third embodiment according to the present disclosure.

FIG. 8 shows the driving circuit with hybrid devices in the third embodiment according to the present disclosure. Please also refer to FIG. 4A. In FIG. 4A, the fifth transistor T15 and the sixth transistor T16 are used to reduce leakage current. In this embodiment, the fourth transistor T14 is set to be an IGZO thin film transistor, and the leakage current has been reduced. Therefore, as shown in FIG. 8, in this embodiment, the fifth transistor T15 and the sixth transistor T16 are omitted, and the source of the fourth transistor T14 is not connected to the third node X12, instead, it is connected to the low voltage DC2 (signal source), and the remaining parts of the circuit are the same as those in the first embodiment. The operations are also substantially the same as those in the first embodiment, and thus a detailed description therefor is deemed unnecessary. Accordingly, this embodiment can simplify the circuit without changing the function of the circuit.

The Fourth Embodiment

Figure 9A:
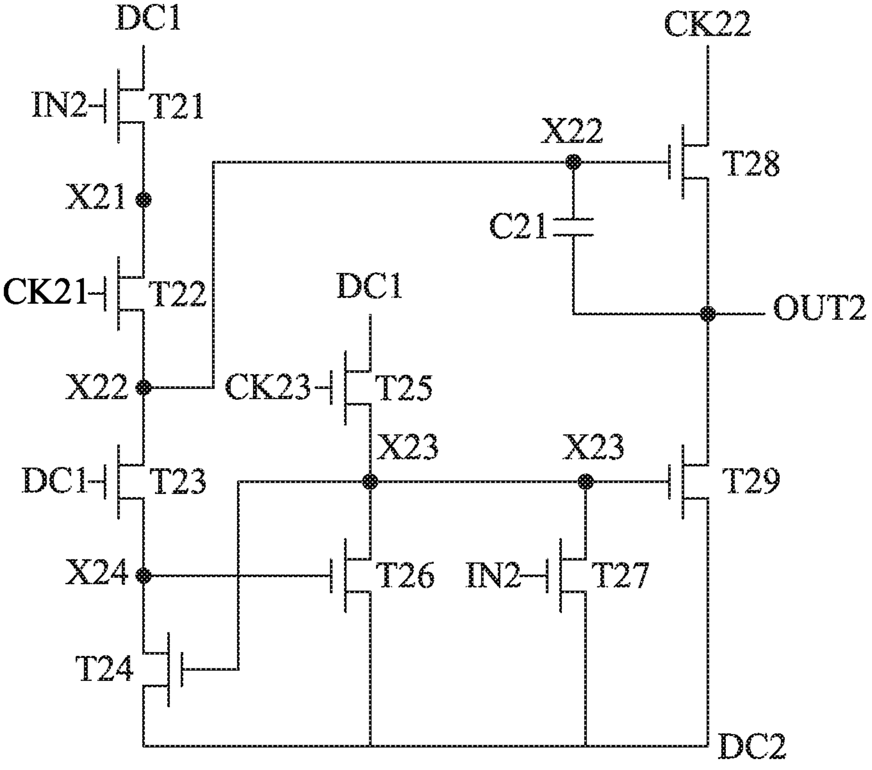
FIGS. 9A and 9B show the driving circuit with hybrid devices in the fourth embodiment of the present disclosure and its signal timing diagram, respectively.

FIG. 9A shows the driving circuit with hybrid devices in the fourth embodiment according to the present disclosure.

This embodiment is a shift register, which includes a first transistor T22, a second transistor T28, a third transistor T25, a fourth transistor T27, a fifth transistor T29, a sixth transistor T24, a seventh transistor T21, an eighth transistor T23, a ninth transistor T26 and a capacitor C21. Each transistor has a control end serving as a gate, one end serving as a source, and the other end serving as a drain. As shown in FIG. 9A, The drain of the seventh transistor T21 is connected to the high voltage DC1 (signal source), the source thereof is connected to the first node X21, and the gate thereof is connected to the input signal IN2 (signal source). The drain of the first transistor T22 is connected to the first node X21, the source thereof is connected to the second node X22, and the gate thereof is connected to the first clock signal CK21 (signal source). The drain of the eighth transistor T23 is connected to the second node X22, the source thereof is connected to the fourth node X24, and the gate thereof is connected to the high voltage DC1 (signal source). The drain of the sixth transistor T24 is connected to the fourth node X24, the source thereof is connected to the low voltage DC2 (signal source), and the gate thereof is connected to the third node X23. The drain of the third transistor T25 is connected to the high voltage DC1 (signal source), the source thereof is connected to the third node X23, and the gate thereof is connected to the third clock signal CK23 (signal source). The drain of the ninth transistor T26 is connected to the third node X23, the source thereof is connected to the low voltage DC2 (signal source), and the gate thereof is connected to the fourth node X24. The drain of the fourth transistor T27 is connected to the third node X23, the source thereof is connected to the low voltage DC2 (signal source), and the gate thereof is connected to the input signal IN2 (signal source). The drain of the second transistor T28 is connected to the second clock signal CK22 (signal source), the source thereof is connected to the output voltage OUT2, and the gate thereof is connected to the second node X22. One end of the capacitor C21 is connected to the second node X22, and the other end thereof is connected to the output voltage OUT2. The drain of the fifth transistor T29 is connected to the output voltage OUT2, the source thereof is connected to the low voltage DC2 (signal source), and the gate thereof is connected to the third node X23.

In this embodiment, the transistors are n-type transistors; that is, the present embodiment is an all n-type transistor circuit, for which the manufacturing is more convenient. In other embodiments, an all p-type transistor circuit and an n-type and p-type hybrid transistor circuit are also applicable.

Figure 9B:
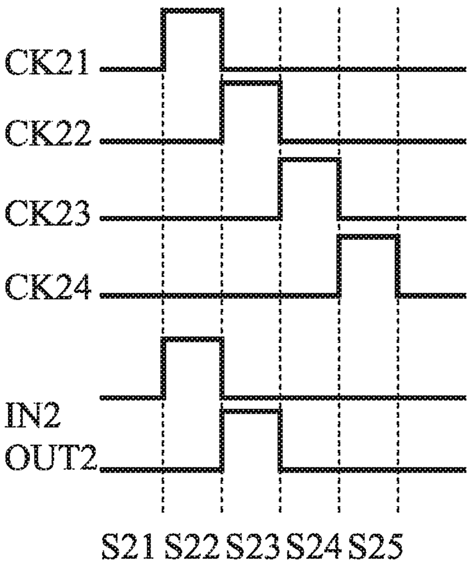

FIG. 9B shows the signal timing diagram of the driving circuit with hybrid devices in this embodiment, wherein clock signals CK21, CK22, CK23 and CK24 cyclically produce square signals in order. The time for a cycle can be set as a frame period. The peak of a clock signal can be set to the high voltage DC1, and the valley thereof can be set to the low voltage DC2. In other embodiment, clock signals could be sine signals, triangle signals, or saw-tooth signals.

Regarding the operation of this embodiment, please refer to FIGS. 9A and 9B.

The operation period S21 is an initial state. In this operation period, all signals are low, so the output voltage OUT2 is low as well.

In the operation period S22, the input signal is high, so the fourth transistor T27 is turned on, and the voltage of the third node X23 is kept low. Therefore, the sixth transistor T24 is turned off, and the voltage of the fourth node X24 stops being pulled down, the fifth transistor T29 is turned off, and the output voltage OUT2 stops being pulled down. Since the seventh transistor T21 is turned on, the current flows from the high voltage DC1 to the first node X21. At the same time, the first clock signal CK21 is high, so the first transistor T22 is turned on, and then the current flows from the first node X21 to the second node X22. Since the gate of the eighth transistor T23 is connected to the high voltage DC1, the eighth transistor T23 is kept to be on. However, the sixth transistor T24 is turned off, so the voltage of the fourth node X24 stops being pulled down. When the voltage of the fourth node X24 is pulled up to the voltage of the second node X22, since there is substantially no voltage difference between them, the current stops flowing through the eighth transistor T23, and completely flows to the capacitor C21. Hence, capacitor C21 is charged, and the voltage of the second node X22 is pulled high, so the second transistor T28 is turned on. However, in this operation period, the second clock signal CK22 is low, so there is no current flowing to the output voltage OUT2.

In the operation period S23, the input signal IN2 and the first clock signal CK21 are low, so the seventh transistor T21 and the first transistor T22 are turned off, and the current stops flowing from the high voltage DC1 to the second node X22. However, due to the capacitor C21, the second transistor T28 is still on. At this time, the second clock signal CK22 is high, the current flows from the second clock signal CK22 to the output voltage OUT2, and the output voltage OUT2 is pulled high.

On the other side, in the operation period S22, the voltage of the third node X23 has become low. In the operation period S23, the voltage of the third node X23 is still low, so the fifth transistor T29 is turned off, and the output voltage OUT2 stops being pulled down.

It is noted that, this embodiment is an all n-type transistor circuit, and an n-type transistor can be turned on only if the gate-source voltage difference (VGS) reaches the threshold voltage (Vth) of the transistor. In order to completely transmit the high voltage DC1 to the output voltage OUT2, the voltage of the second node X22 must be higher than the high voltage DC1 by a threshold voltage (Vth) of the transistor, that is, $V(X22) \geq V(DC1)+Vth$. For this, the capacitor C21 is arranged to pull up the voltage of the second node X22. Since one end of the capacitor C21 is connected to the output voltage OUT2, after the capacitor C21 is charged, the aforementioned formula can be satisfied.

In the operation period S24, there is still no current flowing from the high voltage DC1 to the second node X22. At this time, the second clock signal CK22 is low, so the current stops flowing from the second clock signal CK22 to the output voltage OUT2. In this operation period, the third clock signal CK23 is high, so the sixth transistor T24 is turned on, the current flows from the high voltage DC1 to the third node X23, and the voltage of the third node X23 is pulled high. Therefore, the fifth transistor T29 is turned on, the current flows from the output voltage OUT2 to the low voltage DC2, and the output voltage OUT2 is pulled low.

On the other hand, since the input voltage IN2 is low, the fourth transistor T27 is turned off, and the voltage of the third node X23 stops being pulled down. At the same time, since the third node X23 is high, the sixth transistor T24 is turned on, the current flows from the fourth node X24 to the low voltage DC, and the voltage of the fourth node X24 is pulled low. Then, since the eighth transistor T23 is kept to be on, the current then flows from the second node X22 to the fourth node X24, and the voltage of the second node X22 is pulled low.

In the operation period S25, all signals are low. The state in this operation period returns to the initial state in the operation period S21.

Therefore, as shown in FIG. 9B, the output voltage OUT2 is delayed from the input signal IN2 by a width of a square wave, so this embodiment provides the function of a shift register.

In FIG. 9B, it can be seen that the input signal IN2 is kept low for a long time, so the third node X23 is kept high for a long time. For this, the ninth transistor T26 and the fourth transistor T27 can be IGZO thin film transistors for reducing the leakage current. In other embodiments, the IGZO thin film transistor can be replaced by other kinds of metal oxide thin film transistors, for example, $In_2O_3$, IZO, ZTO, IGO, $SnO_2$, NiO, $Cu_2O$ and ZnO transistors.

Moreover, since the input signal IN2 and the first clock signal CK21 have the same waveform, it is applicable to alternatively use one of the seventh transistor T21 and the first transistor T22.

Moreover, the second transistor T28 can be an LTPS thin film transistor for rapidly pulling up the output voltage OUT2; the fifth transistor T29 can be an LTPS thin film transistor for rapidly pulling down the output voltage OUT2. In other embodiments, an LTPS thin film transistor can be replaced by other kinds of polysilicon thin film transistors.

The Second Comparison Embodiment

In the second comparison embodiment, the ninth transistor T26 and the fourth transistor T27 are set to be LTPS thin film transistors, and the remaining parts of the circuit are the same as those in the fourth embodiment. The operations are also substantially the same as those in the fourth embodiment, and thus a detailed description therefor is deemed unnecessary.

Figure 10:
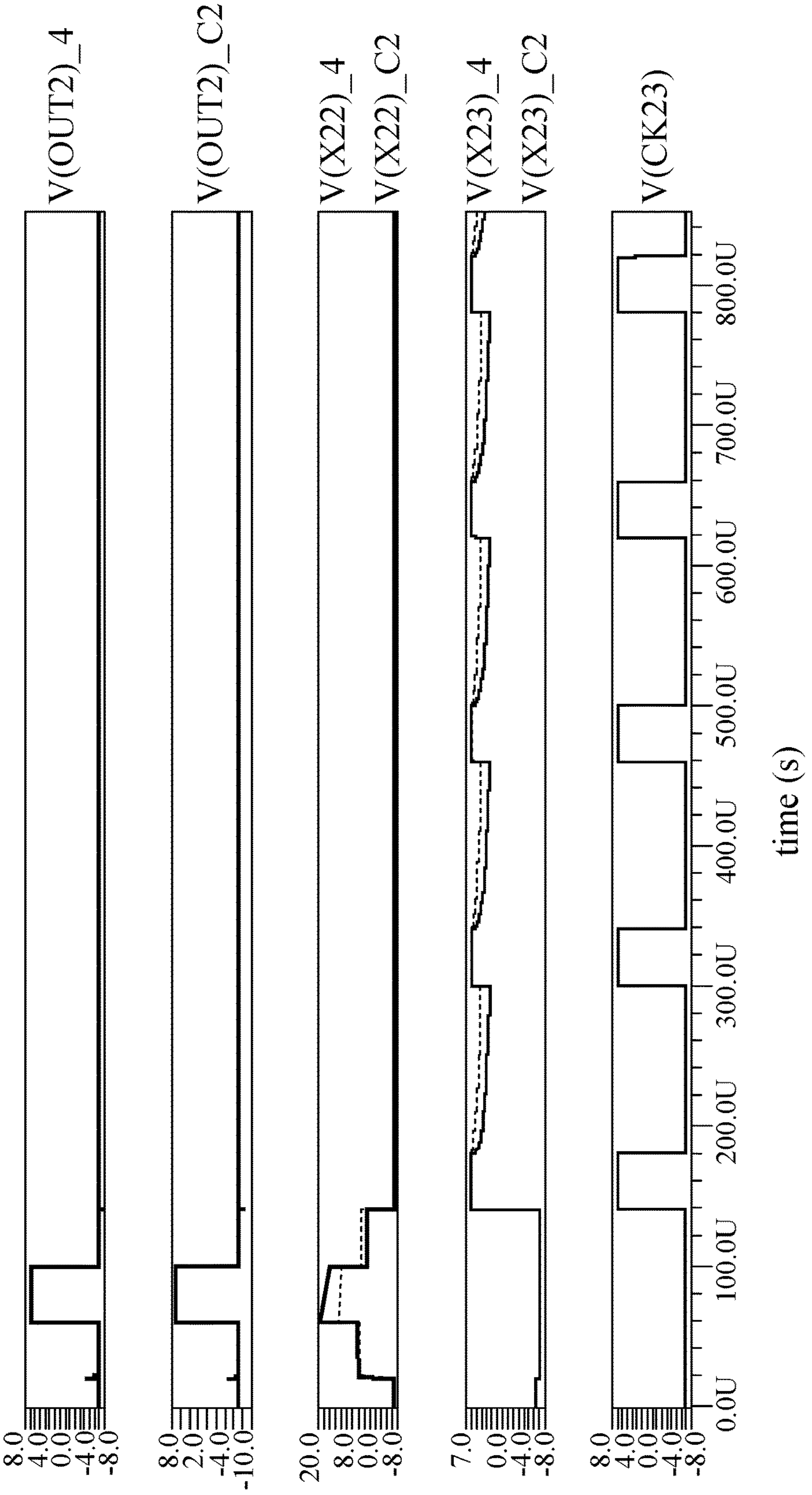
FIG. 10 shows the simulation results of the fourth embodiment and the second comparison embodiment according to the present disclosure.

FIG. 10 shows the simulation results of the fourth embodiment and the second comparison embodiment according to the present disclosure. As shown, V(OUT2)_4, V(X22)_4 and V(X23)_4 represent the output voltage OUT2, the voltage of the second node X22 and the voltage of the third node in the fourth embodiment, respectively; V(OUT2)_C2, V(X22)_C2 and V(X23)_C2 represent the output voltage OUT2, the voltage of the second node X22 and the voltage of the third node in the second comparison embodiment, respectively; V(CK23) represents the voltage of the third clock signal CK23, which is commonly used in the two embodiments. By observing FIG. 10, since the ninth transistor T26 and the fourth transistor T27 in the second comparison embodiment are set to be LTPS thin film transistors, V(X23)_C2 is influenced by the leakage current and thus has a low voltage, and it is also influenced by the third clock signal CK23, resulting in generation of low frequency ripples. Comparatively, since the ninth transistor T26 and the fourth transistor T27 in the fourth embodiment are set to be IGZO thin film transistors, the aforementioned problems can be mitigated.

The Third Comparison Embodiment

Figure 11:
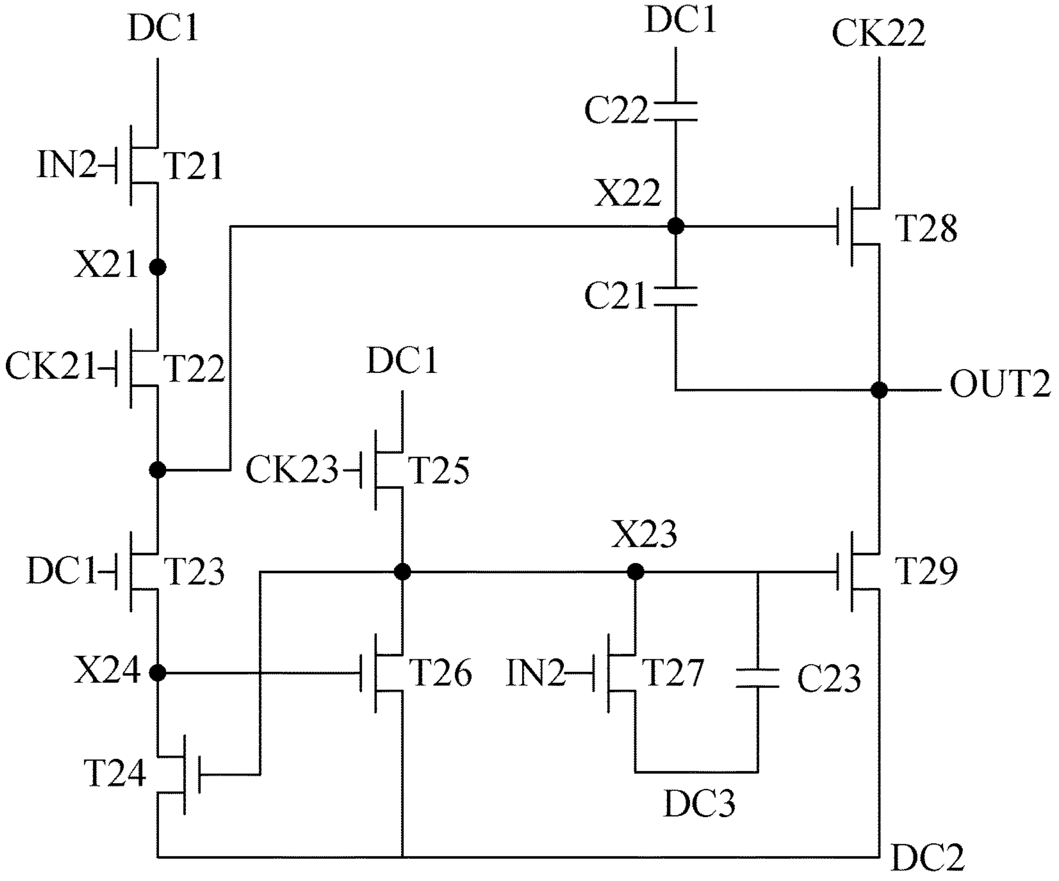
FIG. 11 shows the driving circuit in the third comparison embodiment according to the present disclosure.

FIG. 11 shows the driving circuit in the third comparison embodiment according to the present disclosure. The third comparison embodiment is an improvement based on the second comparison embodiment. In the third comparison embodiment, the source of the fourth transistor T27 is not connected to the low voltage DC2 (signal source), instead, it is connected to the low voltage DC3 (signal source), and two capacitors C22 and C23 are included. The capacitor C22 is connected to the second node X22 and the low voltage DC2 (signal source), and the capacitor C23 is connected to the third node X23 and the low voltage DC3 (signal source). The remaining parts of the circuit are the same as those in the second comparison embodiment. The operations are the same as those in the fourth embodiment, and thus a detailed description therefor is deemed unnecessary.

The third comparison embodiment can improve the performance of the second comparison embodiment. However, compared to the third comparison embodiment, the fourth embodiment omits the capacitor C22 and C23, and thus it can simplify the circuit for facilitating the layout while maintaining the circuit performance.

The Fifth Embodiment

Figure 12:
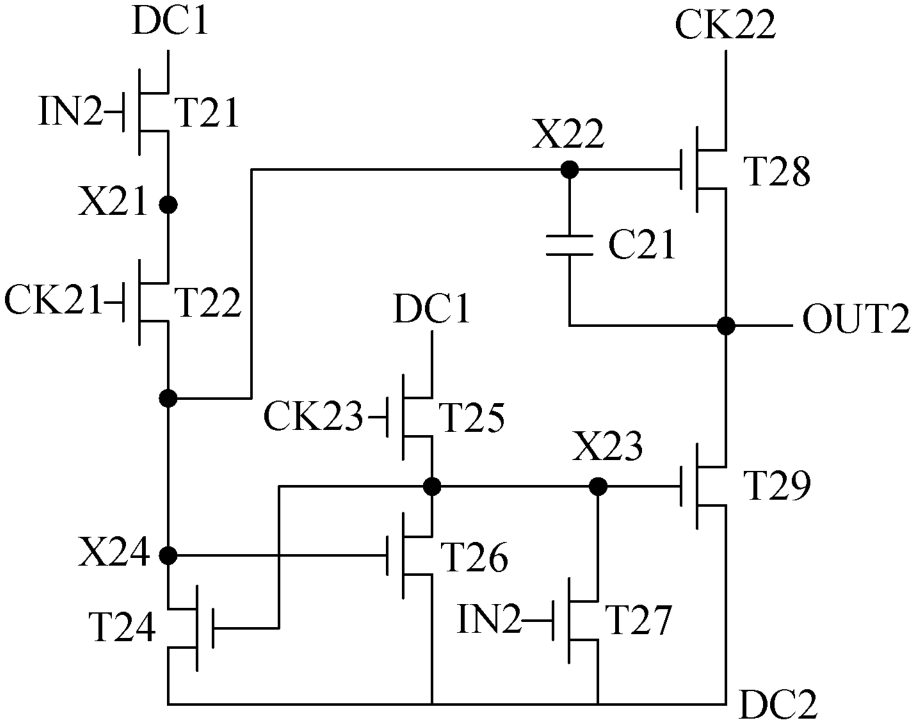
FIG. 12 shows the driving circuit with hybrid devices in the fifth embodiment according to the present disclosure.

FIG. 12 shows the driving circuit with hybrid devices in the fifth embodiment according to the present disclosure. Please refer to FIG. 9A. In FIG. 9A, the eighth transistor T23 is kept to be on due to its gate connected to the high voltage DC1 (signal source), and thus it can be regarded as a wire with low resistance. In this embodiment, as shown in FIG. 12, the eighth transistor T23 is omitted, and the second node X22 is directly connected to the fourth node X24. Therefore, this embodiment can simplify the circuit without changing the function of the circuit.

The Sixth Embodiment

Figure 13:
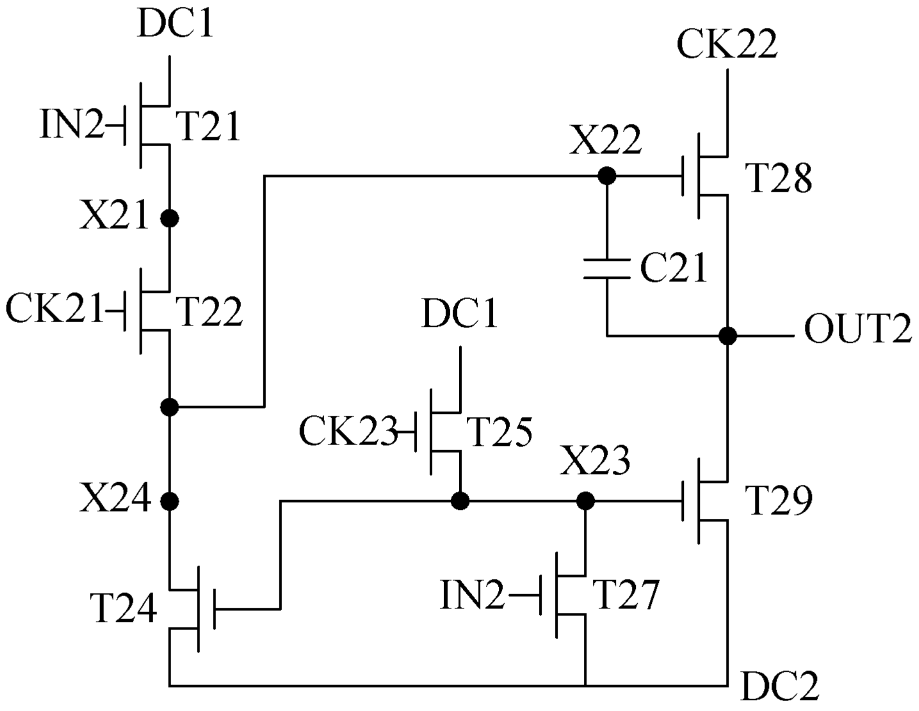
FIG. 13 shows the driving circuit with hybrid devices in the sixth embodiment according to the present disclosure.

FIG. 13 shows the driving circuit with hybrid devices in the sixth embodiment according to the present disclosure. Please refer to FIG. 12. In FIG. 12, the conduction of the ninth transistor T26 and the fourth transistor T27 depends on the input signal IN2, and they are used to pull down the voltage of the third node. In this embodiment, as shown in FIG. 13, the ninth transistor T26 is omitted. Therefore, this embodiment can simplify the circuit without changing the function of the circuit.

Figure 14:
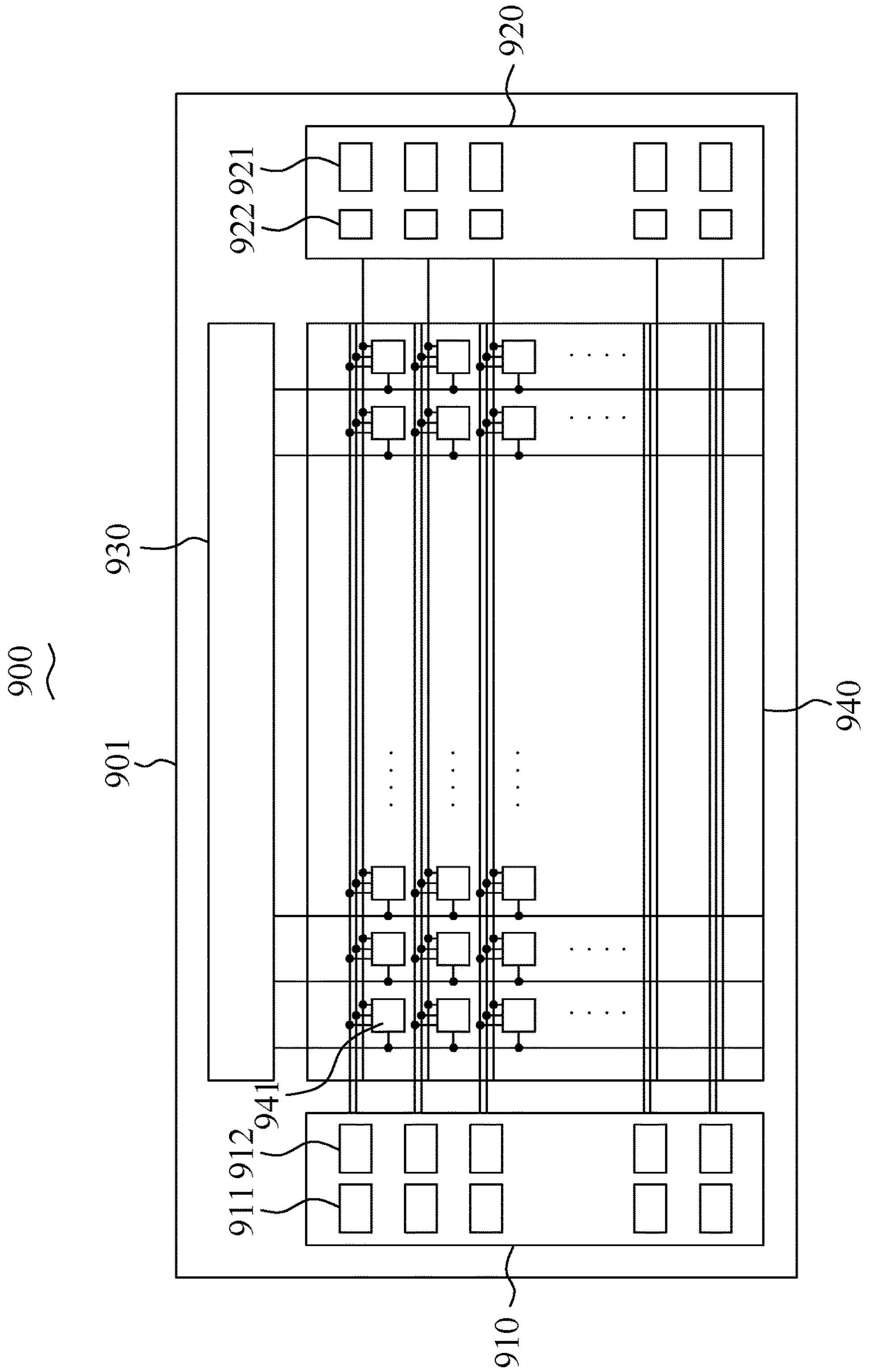
FIG. 14 shows a display according to the present disclosure.

FIG. 14 shows a display according to the present disclosure. As shown in FIG. 14, the display 900 includes a substrate 901, driving circuits 910, 920, 930 and a display area 940. The driving circuit 910 includes shift registers 911, 912. The driving circuit 920 includes shift registers 921 and inverters 922. The display area includes pixel units 941. FIG. 14 can implement the system as shown in FIG. 3. In particular, the shift registers 911 can constitute a series for providing reset signals; the shift registers 912 can constitute a series for providing driving signals; the shift registers 921 can constitute a series for providing emission signals through inverters 922 for controlling the pixels units 941.

Accordingly, the present disclosure integrates polysilicon transistors, particularly LTPS thin film transistors, and metal oxide transistors, particularly IGZO thin film transistors into a circuit for forming a driving circuit with hybrid devices. It is applicable in at least one of driving circuits and pixel units, in particular, applicable in inverters or shift registers of driving circuits of OLED displays. By arranging polysilicon thin film transistors and metal oxide thin film transistors in specific parts of a circuit, these two kinds of transistors can exhibit their advantages.

The aforementioned embodiments are examples only for explanation. The present disclosure is not limited to the aforementioned embodiments, and is to be accorded the claims.

What is claimed is:

1. A display, comprising:

a substrate including a driving circuit with hybrid devices, wherein the driving circuit with hybrid devices comprises:

a first transistor including a first control end, a first end and a second end, the first control end being connected to a first clock signal, the first end being connected to a first node, the second end being connected to a second node;

a second transistor including a second control end, a third end and a fourth end, the second control end being connected to the second node, the third end being connected to a second clock signal, the fourth end being connected to an output voltage;

a third transistor including a third control end, a fifth end and a sixth end, the third control end being connected to a third clock signal, the fifth end being connected to a high voltage, the sixth end being connected to a third node;

a fourth transistor including a fourth control end, a seventh end and an eighth end, the fourth control end being connected to an input signal, the seventh end being connected to a low voltage, the eighth end being connected to the third node;

a fifth transistor including a fifth control end, a ninth end and a tenth end, the fifth control end being connected to the third node, the ninth end being connected to the low voltage, the tenth end being connected to the output voltage;

a sixth transistor including a sixth control end, an eleventh end and a twelfth end, the sixth control end being connected to the third node, the eleventh end being connected to the low voltage, the twelfth end being connected to a fourth node, the fourth node being directly or indirectly connected to the second node; and an eighth transistor including an eighth control end, a fifteenth end and a sixteenth end, the eighth control end being connected to the high voltage, the fifteenth end being connected to the second node, the sixteenth end being connected to the fourth node, wherein the fourth transistor comprises metal oxide semiconductor, and the second transistor comprises polysilicon semiconductor.

2. The display as claimed in claim 1, wherein the driving circuit with hybrid devices further comprises:

a seventh transistor including a seventh control end, a thirteenth end and a fourteenth end, the seventh control end being connected to the input signal, the thirteenth end being connected to the high voltage, and the fourteenth end being connected to the first node.

3. The display as claimed in claim 1, wherein the driving circuit with hybrid devices further comprises:

a capacitor connected to the second node and the output voltage.

4. The display as claimed in claim 1, wherein the driving circuit with hybrid devices further comprises:

a ninth transistor including a ninth control end, a seventeenth end and an eighteenth end, the seventh control end being connected to the fourth node, the seventeenth end being connected to the low voltage, the eighteenth end being connected to the third node.

5. The display as claimed in claim 4, wherein the ninth transistor comprises metal oxide semiconductor.

6. The display as claimed in claim 4, wherein the fifth transistor comprises polysilicon semiconductor.

7. The display as claimed in claim 1, wherein the driving circuit is a shift register.

* * * * *